(12) United States Patent
Mobin et al.

(10) Patent No.: US 6,272,188 B1
(45) Date of Patent: Aug. 7, 2001

(54) SINGLE-CYCLE ACCELERATOR FOR EXTREMUN STATE SEARCH

(75) Inventors: Mohammad Shafiul Mobin, Whitehall; Sivanand Simanapalli, Allentown, both of PA (US); Larry R. Tate, South Barrington, IL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/074,669

(22) Filed: May 8, 1998

Related U.S. Application Data

(60) Provisional application No. 60/066,693, filed on Nov. 24, 1997.

(51) Int. Cl.[7] .................................................. H04L 27/06
(52) U.S. Cl. .......................... 375/341; 375/261; 375/264; 375/265; 364/215.06
(58) Field of Search .................................... 375/341, 340, 375/343, 261, 264, 265, 240.25; 714/795; 364/315.06

(56) References Cited

U.S. PATENT DOCUMENTS

| | | | |
|---|---|---|---|
| 5,537,445 | * 7/1996 | Blaker et al. ....................... | 375/341 |
| 5,726,923 | * 3/1998 | Okumura et al. ................ | 364/715.06 |
| 6,009,128 | * 12/1999 | Mobin et al. ......................... | 375/341 |
| 6,029,267 | * 2/2000 | Simanapalli et al. ................. | 714/795 |

* cited by examiner

Primary Examiner—Stephen Chin
Assistant Examiner—Shuwang Liu
(74) Attorney, Agent, or Firm—David L. Smith

(57) ABSTRACT

The invention includes a method of identifying an extremum value and an index in a group of values where each value has an associated index. A count register is initialized to an initial count. A value from the group as well as a predetermined value are provided simultaneously to an arithmetic logic unit and a multiplexer. The value from the group and the predetermined value are compared in the arithmetic logic unit. A selector is set to one of a first or second logic state. In the first logic state the selector selects a minimum; in the second logic state the selector selects a maximum. One of the value and the predetermined value are selected as an extremum based on a flag set by the comparison in the arithmetic logic unit and the selector. The predetermined value is replaced with the extremum and the count register count is stored when the selector is set to a first state and the value is less than the predetermined value. The predetermined value is replaced with the extremum and the count register count is stored when the selector is set to the second state and the value is greater than the predetermined value.

24 Claims, 3 Drawing Sheets

FIG. 1

| INPUT | PRESENT STATE | | NEXT STATE | |
|---|---|---|---|---|
| | DECIMAL | BINARY | BINARY | DECIMAL |

| INPUT | PS Decimal | PS Binary | NS Binary | NS Decimal |
|---|---|---|---|---|
| 0, 1 | 0 | 0000 | 0000 | 0 |
| | | | $NS_0 = \text{extremum}(PS_0+m_{00}, PS_1+m_{10})$ | |
| 0, 1 | 1 | 0001 | 0001 | 1 |
| | | | $NS_1 = \text{extremum}(PS_2+m_{21}, PS_3+m_{31})$ | |
| 0, 1 | 2 | 0010 | 0010 | 2 |
| 0, 1 | 3 | 0011 | 0011 | 3 |
| | 4 | 0100 | 0100 | 4 |
| | 5 | 0101 | 0101 | 5 |
| | 6 | 0110 | 0110 | 6 |
| | 7 | 0111 | 0111 | 7 |
| | 8 | 1000 | 1000 | 8 |
| | | | $NS_8 = \text{extremum}(PS_8+m_{08}, PS_1+m_{18})$ | |
| | 9 | 1001 | 1001 | 9 |
| | | | $NS_9 = \text{extremum}(PS_2+m_{29}, PS_3+m_{39})$ | |
| | 10 | 1010 | 1010 | 10 |
| | 11 | 1011 | 1011 | 11 |
| | 12 | 1100 | 1100 | 12 |
| | 13 | 1101 | 1101 | 13 |
| | 14 | 1110 | 1110 | 14 |
| | 15 | 1111 | 1111 | 15 |

$NS_k = \text{extremum}(PS_i + m_{ik}, PS_j + m_{jk})$

SINGLE-CYCLE ACCELERATOR FOR EXTREMUN STATE SEARCH

Priority of U.S. Provisional Application Ser. No: 60/066,693 filed Nov. 24, 1997 is hereby claimed.

TECHNICAL FIELD

This invention relates generally to finding a maximum or minimum quantity in a group and an associated index and particularly to finding a minimum or maximum accumulated cost and the associated state at a symbol instant in the process of decoding a signal in a viterbi decoder.

BACKGROUND OF THE INVENTION

A viterbi decoder is a maximum likelihood decoder that provides forward error correction. Viterbi decoding is used in decoding a sequence of encoded symbols, such as a bit stream. The bit stream can represent encoded information in a system that is transmitted through various media in a system with each set of bits representing a symbol instant. Viterbi decoding is employed in digital communications over communication channels such as satellite-to-earth, cellular telephony, microprocessor-to-disk, modem-to-modem and others. Viterbi decoders have been implemented on hardware microprocessors, microcontrollers, and digital signal processors. Viterbi decoding is well-known and applications can be found in U.S. Pat. Nos. 5,490,178; 5,454,014; 5,559,837; 5,465,275; 5,471,500; 5,144,644; and 4,493,082, the disclosures of which are hereby incorporated by reference.

A viterbi implementation consists of four steps: branch and path metric computation; a compare-select operation; a minimum or maximum state cost determination; and a traceback operation to determine a decoded symbol. In the decoding process, a viterbi decoder works back through a sequence of possible bit sequences at each symbol instant to determine which bit sequence was most likely to have been transmitted. The possible transitions from a state at one symbol instant, or present state, to a state at a next, subsequent symbol instant, or next state, is limited. Each possible transition from a present state to a next state can be shown graphically and is defined as a branch. A sequence of interconnected branches is defined as a path. Each state can only transition to a limited number of next states upon receipt of the next bit or bits in the bitstream. Thus, some branches survive to become part of a path and other branches do not survive to become part of a path. By eliminating those transitions or branches that are not permissible, computational efficiency can be achieved in determining the most likely paths to survive. A viterbi decoder typically defines and calculates a branch metric associated with each branch and employs the branch metric to determine which paths survive and which paths do not survive.

A branch metric is calculated at each symbol instant for each possible branch. Each path has an associated metric or accumulated cost that is updated at each symbol instant. For each possible transition, the accumulated cost for the next state is calculated as a sum of the branch metric and the path accumulated cost at the present state origin of the branch metric. A maximum or minimum extremum may be selected.

While several branches, and several paths, survive the transition from one symbol instant to the next symbol instant, a traceback operation through the surviving paths is employed to select the most likely bit or bit sequence to have been transmitted. The sequential symbol instants may be represented in an array referred to as a trellis. Identifying the extremum accumulated cost path starting with a given symbol instant is referred to as a traceback operation. The number of symbol instants back through the trellis that the extremum accumulated cost path extends is the length, or depth, of the traceback operation. At the end of the traceback operation, the individual state in the trellis associated with the surviving path that originated at an extremum accumulated cost is translated into the most likely bit or bits to have been transmitted in that symbol instant. The bit or groups of bits is referred to as a decoded symbol.

In communications applications employing viterbi decoding in which a single bit is transmitted each symbol instant, two possible present states can transition, or branch, into a single next state and a single bit is sufficient to uniquely determine which of the two possible branches transitioned into a given next state.

What is needed is an efficient method for identifying an extremum accumulated cost, such as a maximum or minimum, for use in decoding a received digital signal in a viterbi decoder.

SUMMARY OF THE INVENTION

The invention includes a method of identifying an extremum value and an index in a group of values where each value has an associated index. A count register is initialized to an initial count. A value from the group as well as a predetermined value are provided simultaneously to an arithmetic logic unit and a multiplexer. The value from the group and the predetermined value are compared in the arithmetic logic unit. A selector is set to one of a first or second logic state. In the first logic state the selector selects a minimum; in the second logic state the selector selects a maximum. One of the value and the predetermined value are selected as an extremum based on a flag set by the comparison in the arithmetic logic unit and the selector. The predetermined value is replaced with the extremum and the count register count is stored when the selector is set to a first state and the value is less than the predetermined value. The predetermined value is replaced with the extremum and the count register count is stored when the selector is set to the second state and the value is greater than the predetermined value.

BRIEF DESCRIPTION OF THE DRAWINGS

FIG. 1 is a portion of a present-state, next-state diagram illustrating a sixteen-state example viterbi butterfly in which two possible present states can transition into a single next state;

DETAILED DESCRIPTION

Figure 2:
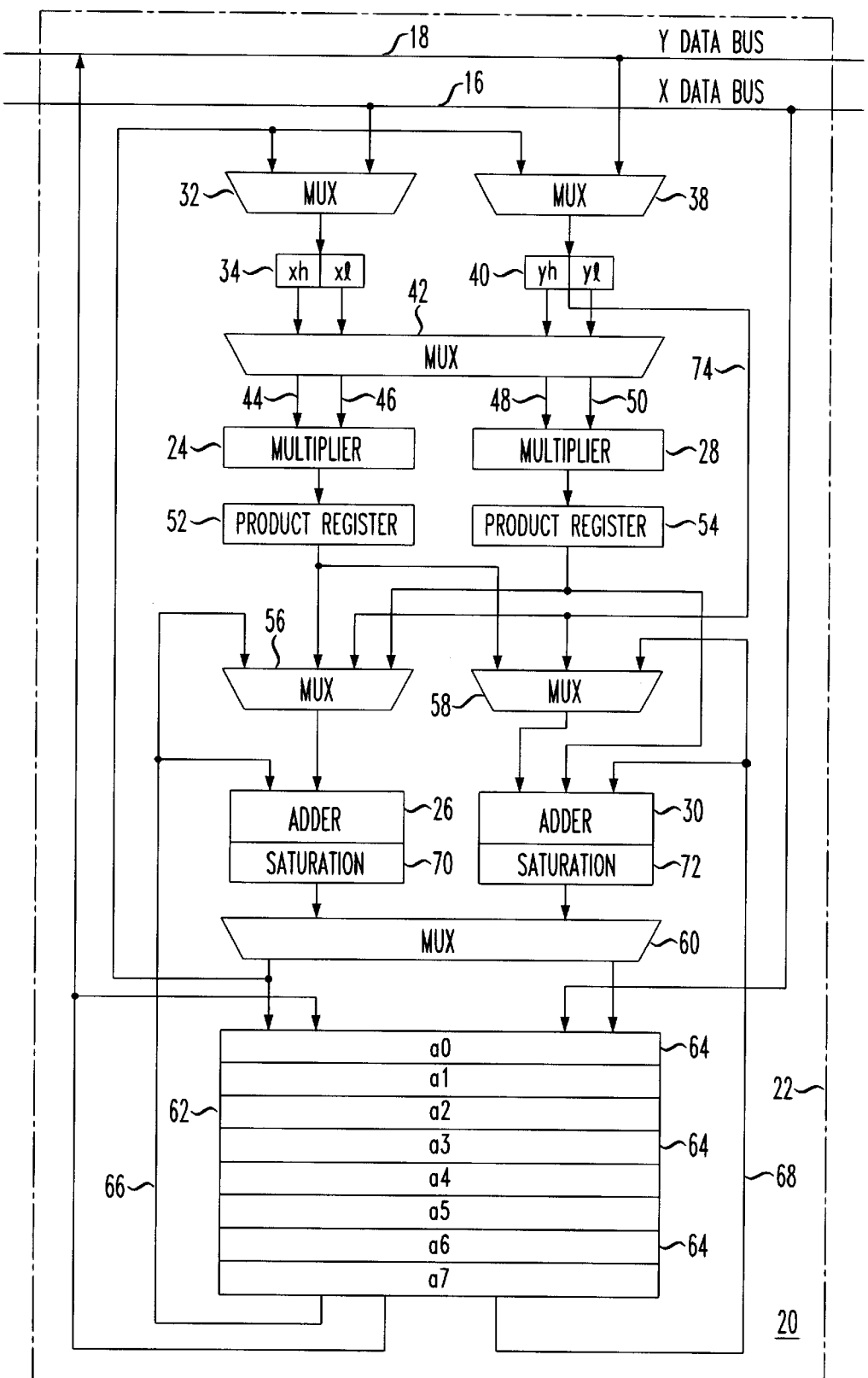
FIG. 2 is a schematic diagram of a portion of a data arithmetic unit that may be used with the present invention.

A portion of a present-state, next-state diagram illustrating a viterbi butterfly in an example having a constraint length of five, resulting in sixteen states in which two possible present states can transition into a given next state is illustrated in FIG. 1. In FIG. 1, the states are designated in both decimal and binary notation; in the text states may be designated in either notation. With a right-shifting of a single bit input zero, either of the first two present states $PS_0$: 0000, or $PS_1$: 0001 will transition into next state $NS_0$: 0000 as the last bit of the present state is shifted out. While not all of the possible transitions have been illustrated, each of the sixteen next states has, upon receipt of all combinations of single bit inputs, two present states that can transition to each of the next states. Expressed differently, each of the sixteen next states can have two present states transition to it upon receipt of all combinations of single bit inputs. Thus, for a sixteen state example as shown in FIG. 1, there are thirty-two possible branch transitions from present states to next states. Only a limited number of the thirty-two possible branches are illustrated.

Each of the branches has an associated branch metric designated $m_{ij}$, where i represents the present state and j represents the next state at respective ends of the branch. Each of the present states has an accumulated cost, $PS_i$, associated with the $i^{th}$ present state, where i=0, 1, 2, . . . , 15. Accumulated cost $PS_i$ is the sum of the branch metrics associated with surviving branches of all branches in a path up to the present state. The accumulated cost metric for the next state $NS_j$ is the sum of the present state accumulated cost $PS_i$ associated with the $i^{th}$ present state and one of the branch metrics $m_{ij}$ which may be, for example, based on a Euclidean or Hamming, sometimes known as Manhattan, distance.

The two branch metrics $m_{ij}$ that terminate in a given next state, such as next state $NS_0$, are computed and added to the present state accumulated cost to produce two potential next state costs which are compared. An extremum potential next state cost (either a maximum or minimum) is selected in the comparison operation as a next state cost associated with the next state at which the extremum potential next state cost metric terminates. The present state-to-next state transition associated with the extremum metric is a branch in a surviving path. The extremum metric is a next state cost associated with the next state at the end of the surviving branch. The bit from the present state that would be shifted out may be stored as a traceback bit to be used in reconstructing a traceback path of surviving branches. Similar computations with respect to all of the present states results in an update of accumulated costs for all of the next states and storage of a traceback bit associated with each next state. Thus, when metric $m_{00}$ comprises part of the extremum, zero may be stored as a single-bit traceback; when metric $m_{10}$ comprises part of the extremum, a one may be stored as a traceback bit.

The two branch metrics associated with a given next state are computed and added to the respective present state costs associated with the origin of the branch metric to generate two potential next state costs $PNS_{00}$ and $PNS_{10}$. The two potential next state cost metrics are compared in a data arithmetic unit 20 shown in FIG. 2 such as in a microprocessor, microcontroller or digital signal processor, to select an extremum of the two potential next state costs.

FIG. 2 shows a schematic diagram of a portion of a data arithmetic unit (DAU) 20 which may be part of an integrated circuit. The integrated circuit may be part of a transceiver in a communications system or a portion of a communications system such as a mobile digital cellular telephone. DAU 20 is a portion of a processor 22 such as a microcontroller, microprocessor, or digital signal processor. DAU 20 includes at least two multiply-accumulate paths. Multiplier 24 and adder 26 provide a first multiply-accumulate path; multiplier 28 and adder 30 provide a second multiply-accumulate path. Multiplexer 32 may have inputs coupled to a first databus 16, also designated the X databus, and a feedback path 36 from the output of adders 26 and 30. Multiplexer 32 selects an input to a first input register 34 from a plurality of inputs. Input register 34 may be segmented into high and low portions represented as xh and xl. The high and low portions typically each contain n bits, where n is an arbitrary number. In a preferred embodiment, n is sixteen. First input register 34 is a 2n-bit register having high and low portions. An n-bit word can be multiplexed into each of the high portion, xh and low portion, xl. The expression 2n-bit is intended to be twice a word length n bits plus appropriate guard bits.

Multiplexer 38 selects an input from the plurality of inputs as an input to second input register 40, also designated the y register. Second input register 40 may be segmented into high and low portions containing yh and yl. The high and low portions typically contain n bits. Similarly, second input register 40 is a 2n-bit register having high and low portions. Multiplexer 38 may be coupled to a second databus 18, also designated the Y databus, and feedback path 36 from the output of adders 26 and 30.

The bits from xh and xl portions of first input register 34 as well as the bits from yh and yl portions of second input register 40 are independently available to each multiplier 24 and 28 by way of crossover multiplexer 42. Crossover multiplexer 42 provides two inputs to each multiplier 24 and 28. Inputs 44 and 46 are provided to multiplier 24; inputs 48 and 50 are provided to multiplier 28. An n-bit word can be multiplexed into each of the high half and low half of each of registers 34 and 40. The output from either the high half or low half of either first input register 34 or second input register 40 can provide any of the inputs 44, 46, 48 or 50 to multipliers 24 and 28 through crossover multiplexer 42. Each multiplier 24 and 28 multiplies the inputs it receives and provides a product output. The product output from multiplier 24 is stored in a first product register 52, and is provided as an input to both multiplexers 56 and 58. Similarly, the product output from multiplier 28 is stored in a second product register 54, and is provided as an input to both multiplexer 56 and multiplexer 58. Multiplexers 56 and 58 also have available as an input the contents of second input register 40.

Accumulator file 62 is comprised of a plurality of registers 64. Registers 64 comprising accumulator file 62 are also 2n-bit registers accessible by high and low portions. The output of accumulator file 62 is coupled by line 66 as an input to multiplexer 56 and adder 26, and by line 68 as an input to multiplexer 58 and adder 30.

The output of multiplexer 56 provides an input to adder 26. The sum output from adder 26 is passed through saturation block 70 to limit the output to an extremum value during overflow, and coupled as an input to multiplexers 32, 38 and 60. Similarly, the output of multiplexer 58 provides an input to adder 30. The sum output from adder 30 is passed through saturation block 72 to limit the output to an extremum value during overflow, and is coupled as an input to multiplexers 32, 38 and 60. Multiplexer 60 can provide the output of either adder 26 or 30 to any of registers 64 in accumulator file 62.

The select inputs to the various multiplexers are set by an instruction decoder in a control section of the processor architecture, not shown, to choose the appropriate input as an output.

In a preferred embodiment, adder 30 is a three-input adder, and adder 26 has at least two inputs. Each of adders 26 and 30 provide a sum output that is a combination of the adder inputs. In addition, either or both adders may be split adders. Split adders can perform two additions or two subtractions such as by combining the high order bits of two operands and the low order bits of two operands. While adder 26 has been characterized as an adder, adder 26 can be an arithmetic logic unit capable of performing logical operations as well as addition and subtraction operations.

Adder 26 may receive one of its inputs from the output of either multiplier 24 or multiplier 28 by way of product register 52 and 54 and multiplexer 56. Similarly, adder 30 may receive one or two inputs from the outputs of multiplier 24 and multiplier 28 by way of product register 52 and 54, and in the case of the output from multiplier 24, multiplexer 58. In this manner, the output of multiplier 24 in the first datapath can be provided as an input to either adder 26 in the first datapath or adder 30 in the second datapath, or both. Similarly, the output from multiplier 28 in the second datapath can be provided as an input to adder 30 in the second datapath or adder 26 in the first datapath, or both.

Two inputs to adder 26 may be provided as outputs from registers 64 of accumulator file 62 by way of line 66. While one input to adder 26 may be provided directly from the output of register file 62, another input may be provided through multiplexer 56. Similarly, two inputs to adder 30 may be provided as outputs from registers 64 of accumulator file 62 by way of line 68. While one input to adder may be coupled directly to the output of register 64 of accumulator file 62, a second input to adder 30 is coupled through multiplexer 58 by way of line 68.

Implementation of a portion of the signal processing, such as in a transceiver, may be achieved in the DAU illustrated in FIG. 2. The signal processing includes the steps of (1) branch and path metric computation; (2) a compare-select operation; (3) an extremum (minimum or maximum) cost determination; and (4) a traceback operation. DAU 20, when operating in a pipelined manner performing viterbi decoding such as when part of a transceiver, performs the following steps in a single clock cycle in accordance with the present invention. They include performing a compare-select operation to identify one of two potential next state accumulated costs as an extremum of the two potential next state accumulated costs.

Before discussing an instruction, which when implemented, causes DAU 20 to simultaneously perform the steps listed above in a viterbi decoding operation, the instructions to fill the pipeline will first be explained. Pipelining is achieved by initiating computation with a new data set before completing computations with a previous data set. The more latches used in pipelining, the greater the depth of pipelining. Pipelining causes an initial latency in computation time required to fill the pipeline, but maximizes usage of resources such as adders. Equations (1) through (4) illustrate filling the pipeline. Once the pipeline is filled, equations (5) through (8) may be executed repeatedly to perform the metric computation and add-compare-select operations of viterbi decoding. A new received symbol will be loaded in accordance with equation (1), as required $$a5 = *r1++ \tag{1}$$

$$y = *r0++ \tag{2}$$

$$xh = a5h - yh \; x1 = a51 - y1 \; y = *r0++ \tag{3}$$

$$xh = a5h - yh \; x1 = a51 - y1 \; p0 = xh2 \; p1 = x12 \\ y = *r0++ \; a4h = *pt0++ \tag{4}$$

$$xh = a5h - yh \; x1 = a51 - y1 \; a0 = a4 + p0 + p1 \; p0 = xh2 \; p1 = x12 \\ y = *r0++ \; a4h = *pt0++ \tag{5}$$

$$xh = a5h - yh \; x1 = a51 - y1 \; a1 = a4 + p0 + p1 \; p0 = xh2 \; p1 = x12 \\ y = *r0++ \; a4h = *pt0++ \tag{6}$$

$$a0 = cmp1(a1, a0) \; a1 = a0 - a1 \tag{7}$$

$$a2 = cmp0(a0, a2) \tag{8}$$

Equation (1) loads the received symbol to which pointer r1 is pointing into accumulator 62, file register a5 for processing. Equation (2) loads an estimated symbol into the second input register 40, also designated the y register.

Equation (3) from left-to-right computes the in-phase and quadrature differences between the received symbol loaded in equation (1) and an estimated symbol loaded in equation (2). Equation (3) also loads a new estimated symbol into second input register 40.

Equation (4) from left-to-right computes the in-phase and quadrature differences between the received symbol of equation (1) and an estimated symbol of equation (3). The in-phase and quadrature differences computed in equation (3) are squared and stored in product register 52, also known as register p0 and product register 54, also known as register p1. A new estimated symbol is loaded into second input register 40, and a present state cost is loaded into accumulator file 62 register a4h. This sequence fills the pipeline for iterative computations represented by equations (5) through (8). Each occurrence of a new received symbol necessitates executing equations (1) through (4) to reinitialize the pipeline. Equation (7) is a compare/select instruction that compares the two potential next state costs, one computed by equation (5) and the other computed by equation (6), and selects an extremum (either a maximum or minimum) for further processing, as is known in the art, and simultaneously computes as a soft decision the difference between the two potential next accumulated costs calculated in equation (5) and (6) and store the soft decision in register a1.

An instruction, which when implemented, causes DAU 20 to simultaneously perform the steps listed above, and which is representative of equations (5) and (6) is shown as equation (9).

$$xh = a5h - yh \; x1 = a51 - y1 \; a0 = a4 + p0 + p1 \; p0 = xh2 \; p1 = x12 \\ y = *r0++ \; a4h = *pt0++ \tag{9}$$

Equation (9) instructs DAU 20 to simultaneously, in a single clock cycle, perform all of the functions in equation (9) in a pipeline environment.

The following description assumes the pipeline is full. Starting from the right side of equation (9), a present state cost, PS(1) is retrieved from the X data bus 16 and is loaded into the high portion of an accumulator register 64, designated register a4.

An estimated symbol e(3) that is an estimate of the received symbol is retrieved from the Y data bus 18, passed through multiplexer 38 and stored in the second input register 40. For example, the in-phase estimated symbol $e_I(3)$ may be stored in the high portion, yh, of second input register 40 and the quadrature estimated symbol $e_Q(3)$ may be stored in the low portion, y1, or the second input register 40. The estimated symbol is also provided as an input to adder 26 by way of line 74.

A metric is calculated; the Euclidean metric is illustrated. The difference between quadrature received and estimated symbols, computed in a previous clock cycle in the pipeline and stored in the low portion, x1, of first input register 34, is squared. The low portion, x1, of first input register 34 provides both inputs 48 and 50 to multiplier 28 by way of multiplexer 42. The difference between the quadrature received, $X_Q(n)$, and estimated symbols is squared in multiplier 28 and stored in product register 54, also designated p1. The quantity being computed is:

$$[X_Q(n) - e_Q(1)]^2.$$

Similarly, the difference between in-phase received and estimated symbols, also computed in a previous clock cycle in the pipeline and stored in the high portion, xh, of the first input register 34 is squared. The high portion, xh, of the first input register 34 provides both inputs 44 and 46 to multiplier 24 by way of multiplexer 42. The difference between the in-phase received and estimated symbols is squared in multiplier 24 and stored in product register 52, also designated register p0. The quantity being computed is:

$$[X_I(n)-e_I(1)]^2.$$

The present state cost is updated to generate a next state cost by adding to the present state cost stored in accumulator register file 62, register a4, the squared differences produced by multipliers 24 and 28 and stored in product registers 52 and 54. Register a4 of accumulator register file 62 provides a first input to adder 30 by way of line 68. Product register 52 and second input register 40 provide two inputs to adder 30 by way of multiplexer 58. Second input register 40 provides another input directly to adder 30. Adder 30 adds the squared differences to the present state cost to generate a first potential next state cost, $PNS_{00}$. The quantity being computed is:

$$PNS_{00}=PS(0)+[X_I(n)-e_I(0)]^2+[X_Q(n)-e_Q(0)]^2$$

The first potential next state cost, which is the sum output from adder 30 is stored in accumulator file 62 register a0.

The received symbol being processed is stored in accumulator 62 register a5. The in-phase portion of the received symbol is stored in the high portion of register a5 and the quadrature portion of the received symbol is stored in the low portion of register a5. The received symbol is provided as an input to adder 26 by way of line 66. Adder 26 is capable of performing two separate n-bit addition or subtraction operations, one on the lower end bits and one on the upper end bits. Adder 26 operates as a split adder to compute the difference between the quadrature portions of the received and estimated symbols in the low half and the difference between in-phase portions of the received and estimated symbols in the high half.

The difference between the received and estimated symbols is provided as an input to the first input register 34 over feedback path 36, by way of multiplexer 32, in preparation for another metric calculation, sometimes referred to as a branch metric calculation. Feedback path 36 permits the output of either adder 26 or 30 to be latched into either the high or low portions of either first or second input registers 34 or 40, as desired. In this manner, feedback path 36 from adders 26 and 30 are used to compute two differences simultaneously. Adder 30 computes the path metric by summing the two branch metrics and the present state cost.

Equation (5) computes, among other quantities, a first potential next state cost and stores the first potential next state cost in register a0 of accumulator file 62. Equation (6) calculates, among other quantities, a second potential next state cost and stores the second potential next state cost in register a1 of accumulator file 62. Equation (7) is an instruction, which when implemented, causes DAU 20 to simultaneously perform the steps of calculating a soft decision confidence level and performing a compare-select operation to identify one of the two potential next state costs calculated in equations (5) and (6) as an extremum next state cost. The first potential next state cost calculated in Equation (5) is provided as a first input to adder 30 and the second potential next state cost calculated in Equation (6) is provided as a second input to adder 30. The third input to adder 30 is set to zero. The difference between the two potential next state costs computed by and output from, adder 30 is a soft decision confidence level that is stored in register a1 of accumulator file 62. Simultaneously with calculating the soft decision confidence level in adder 30, the potential next state costs calculated in Equations (5) and (6) are provided as the two inputs to adder 26 operating as an arithmetic logic unit. An extremum of the two potential next state costs, either the larger or smaller in this example, is selected by setting an extremum bit. The extremum potential next state cost is selected as the next state cost and is stored in register a0 of accumulator file 62. Equations (5) through (8) are repeated for each pair of present states in the symbol instant that have a branch metric that terminates at a next state, as represented in the viterbi butterfly of FIG. 1.

The two branch metrics associated with a given next state are computed and added to the respective present state cost associated with the origin of the branch metric to generate two potential next state costs $PNS_{00}$ and $PNS_{10}$ in equations (5) and (6), and stored in registers a0 and a1 of accumulator file 62. The two potential next state cost metrics are systematically compared in a data arithmetic unit 20, shown in a simplified schematic in FIG. 3, to select an extremum next state cost from the two potential next state costs.

In the example in FIG. 1, the number of next state accumulated costs are 16. An extremum next state cost is identified as the state at the present symbol instant from which a traceback, of a predetermined length, should be initiated to decode a symbol at the symbol instant at the end of the traceback. At each symbol instant, the state at which a traceback operation should commence may be determined by generating all of the next state accumulated costs and comparing them to identify an extremum next state cost, either a maximum or a minimum, and its associated state. Alternatively, each next state accumulated cost may be compared as it is generated to a current extremum next state cost, with the index represented by the associated state of the current extremum next state cost. The latter technique will be explained; an understanding of the former technique to be readily evident from the explanation of the latter technique.

Prior to generating the first next state accumulated cost, a state counter 100 and a current extremum register a2 are initialized. Typically, the state counter 100 is initialized to zero, such as by writing a zero to the register. How the current extremum register a2 is initialized depends on whether the desired extremum of the next state cost is a minimum or a maximum. To identify an extremum next state cost that is a minimum, a very large value (such as the largest value that can be stored in the current extremum register) is written to the current extremum register a2. Writing a large value to the current extremum register assures that when the next state accumulated cost associated with the first state is compared to the value stored in the extremum register, the next state cost associated with the first state will be selected as the current extremum and will be written to the extremum register a2. Similarly, to identify an extremum next state accumulated cost that is a maximum, a very small value (such as the smallest value that can be stored in the current extremum register) is written to the current extremum register a2 during initialization.

Figure 3:
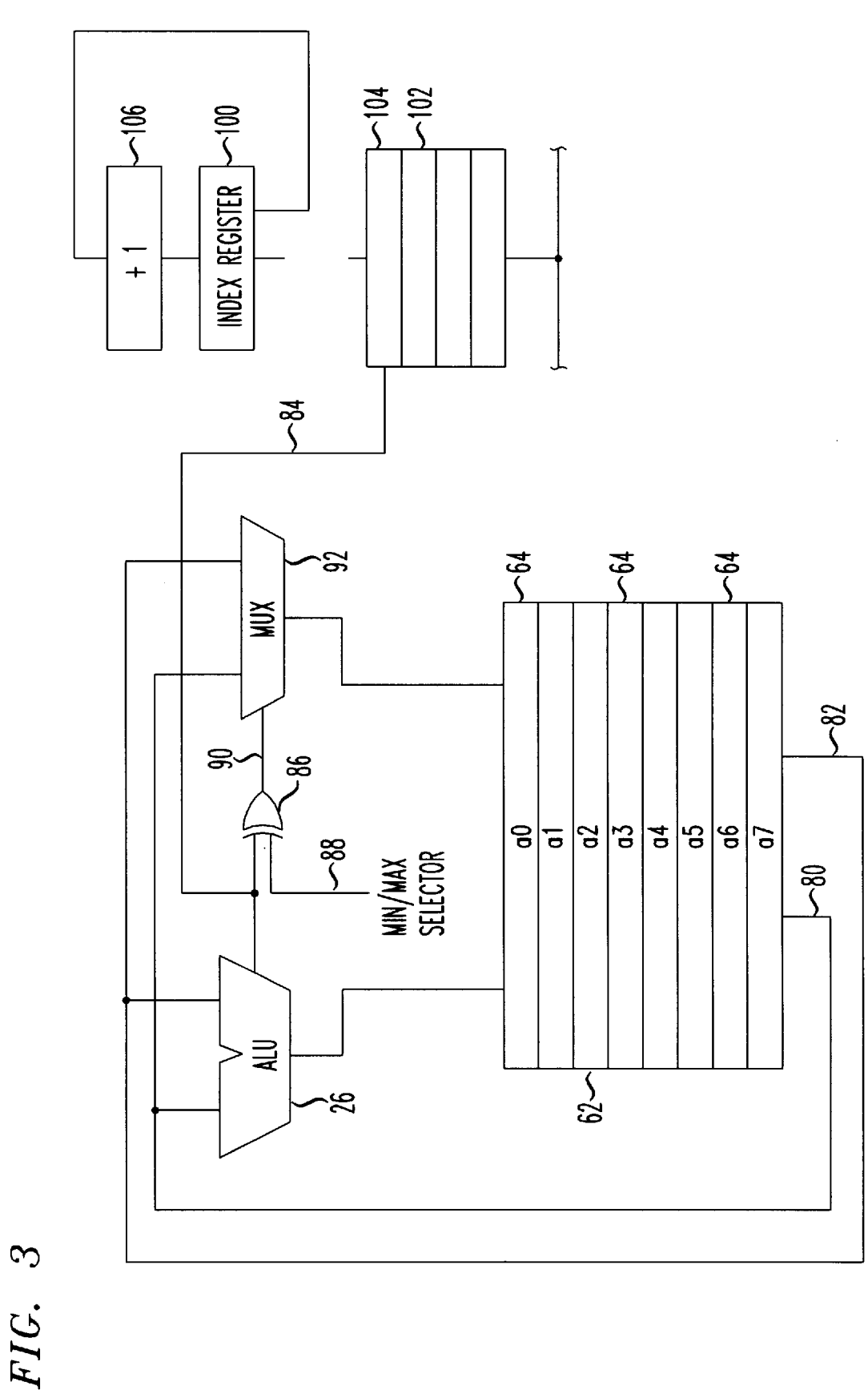
FIG. 3 is a simplified schematic diagram of the data arithmetic unit including maximum/minimum selection circuitry and counter circuitry.

As shown in the simplified diagram of FIG. 3, when equation (8) is executed, the most recently determined next state cost stored in register a0 by execution of equation (7) is compared to the value retained in current extremum register a2. The comparison is achieved by simultaneously providing the next state cost from register a0 and the value retained in the current extremum register a2, as inputs to arithmetic logic unit (ALU) 26, illustrated over lines 80 and line 82. ALU 26 compares the two inputs, such as by computing the difference. The ALU sign flag of the difference is provided over line 84 as an input to extremum register 104. The sign flag of the difference indicates which of the two inputs to ALU 26 was selected as the extremum.

A one bit input selector 88 is also provided to ALU 26. One bit input selector 88 takes on one of a first and second state to select either the lesser or greater of the two inputs being compared in the ALU. Selecting the lesser input to ALU 26 corresponds to selecting the minimum next state cost as the extremum next state cost and selecting the greater input to ALU 26 corresponds to selecting the maximum next state cost as the extremum next state cost. Depending on the manner in which numbers are represented, a min/max selector of a first state such as a logical one may select the lesser input whereas a min/max selector of a second state such as a logical zero may select the greater input to the ALU. ALU 26 selects one of the two inputs as the extremum next state cost and stores the selected extremum next state cost in register a2.

State counter 100 tracks the index of the potential next state cost stored in register a0. State counter 100 is initialized, such as to zero (or one depending on how the indices are counted), each occurrence of incrementing the symbol instant. The comparison and selection operation of equation (8) compares the most recently computed potential next state cost from register a0 to the extremum of the previously computed next state costs for that symbol instant (or the initialized extremum value) stored in register a2, which has an index generated in state counter 100, and writes the extremum into register a2.

When the extremum potential next state cost, read from register a2 for the comparison is selected in the comparison operation as the extremum, the extremum potential next state cost in register a2 remains unchanged, state counter 100 is incremented, a new potential next state cost is computed, and the comparison and selection operation of equations (7) and (8) repeated.

When the extremum potential next state cost, read from register a2 for comparison, is not selected in the comparison operation of equation (8) as the extremum, the most recently computed next state cost, read from register a0, is written to register a2 as the extremum, overwriting the former extremum. Also when the most recently computed next state cost is selected as an extremum in the comparison operation of equation (8), output 84 changes state, such as changing from a logic zero to a logic one, and the state counter value stored in state counter 100 is transferred to extremum index register 104. In addition, the most recent traceback bit or bits, as represented by the least significant bit (or bits), of the value stored in traceback bits register 102 are written to, and thereby packed into, the extremum index register 104, such as to the low order bits of extremum index register 104. This creates information in extremum index register 104 that identifies the index of the extremum next state cost and sufficient traceback information to, through a traceback operation, identify which state at a previous symbol instant a branch originated to terminate at the extremum next state cost, the index of which is retained in extremum index register 104.

One way to pack both the index of the extremum next state cost and a traceback bit into a single register is to shift the index of the extremum next state cost left or right one bit position, and insert the traceback bit into the bit position made available due to the shift operation. The invention is not limited to a shift left or right by one bit position. A shift left or right of two or more bit positions are within the scope of the invention. Although generally the index of the extremum next state cost would be shifted by a number of bit positions corresponding to the number of traceback bits to be packed into a register, the invention is not limited thereto.

Subsequent to the comparison operation of equation (8), the state counter 100 is updated, for example, such as by being incremented by one.

The information stored in extremum index register 104 identifies an extremum index and traceback information for a symbol instant. This information may be written to another memory location, such as over bus 108, for use in a traceback operation. The traceback bit or bits may also be stored separately for use in a traceback operation, and packed multiple traceback bits per word of storage to conserve memory. At the last symbol instant, upon completion of the comparisons of equation (8), extremum index register 104 contains the index of the state at which a traceback operation can be initiated, together with sufficient information to identify the state at the next previous symbol instant a branch originated that terminated at the extremum next state cost identified by the index also in extremum index register 104.

By executing equations (5) and (6), followed by a compare-select operation and soft decision calculation, such as equation (7) repeatedly once the pipeline is full, the entire viterbi add-compare-select operation can be completed. Also including a next state cost comparison as in equation (8) identifies the state at each symbol instant at which a traceback operation will be initiated. With the pipeline filled, a next state cost comparison is completed in one clock cycle by execution of equation (8).

The invention is particularly useful in communication systems and equipment employing integrated circuits using this technique. Such communication systems and equipment have the advantage when using a dual adder processor to provide a compare-select operation in a single clock cycle. Simultaneously with performing the compare operation, one or more traceback bits may be stored for use in a traceback operation as well as soft decision, as is known in the art.

Although the invention has been described as comparing next state accumulated costs beginning with the first state, the sequence in which the next state accumulated costs are compared may be varied.

Although the invention has been described as being useful to identify an extremum next state accumulated cost and an associated index in the process of decoding a signal in a viterbi decoder, the invention is not limited thereto. The invention may be used to identify an extremum and an associated index in, for example, an array of values.

References to time or the sequence of calculating a quantity, such as "the most recently computed next state cost", are present in the description to explain operation of the invention. The sequence of calculating quantities such as the next state cost can vary and still be within the invention.

The invention claimed is:

1. A method of identifying an extremum value and an index in a group of values, each value having an associated index, comprising the steps of:
   initializing a count register to a count;
   providing a value from the group to an arithmetic logic unit;
   providing a predetermined value to the arithmetic logic unit;
   comparing the value from the group and the predetermined value in the arithmetic logic unit;
   setting a selector to one of a first and second state, the first state to select a minimum and the second state to select a maximum;

selecting one of the value and the predetermined value as an extremum based on a flag set by the comparison in the arithmetic logic unit and the selector;

bit-shifting the count register count to produce a shifted count register count;

replacing the predetermined value with the extremum and storing the shifted count register count when the selector is set to the first state and the value is less than the predetermined value; and packing at least one traceback bit with the shifted count register count.

2. A method as recited in claim 1, wherein the method is conducted in a pipeline environment.

3. A method as recited in claim 1, further comprising the steps of:

changing the count register count; and providing another value from the group for comparison to the predetermined value.

4. A method of identifying an extremum value and an index in a group of values, each value having an associated index, comprising the steps of:

initializing a count register to a count;

providing a value from the group to an arithmetic logic unit;

providing a predetermined value to the arithmetic logic unit;

comparing the value from the group and the predetermined value in the arithmetic logic unit;

setting a selector to one of a first and second state, the first state to select a minimum and the second state to select a maximum;

selecting one of the value and the predetermined value as an extremum based on a flag set by the comparison in the arithmetic logic unit and the selector;

replacing the predetermined value with the extremum and storing the shifted count by;

packing the count register count and a traceback bit that identifies a branch origin at a previous symbol instant into a single register when the selector is set to the first state and the value is less than the predetermined value.

5. A method as recited in claim 4, wherein the packing step further comprises:

shifting the count register count by a predetermined number of bit positions; and inserting a predetermined number of traceback bits, corresponding to the predetermined number of bit positions, into the bit positions made available due to shifting the count register count.

6. A method as recited in claim 5, wherein the shift is a left shift.

7. A method as recited in claim 5, wherein the shift is a right shift.

8. A method as recited in claim 5, wherein the predetermined number of bit positions is one.

9. A method as recited in claim 5, wherein the predetermined number of bit positions is two.

10. A method of identifying an extremum value and an index in a group of values, each value having an associated index, comprising the steps of:

initializing a count register to count;

providing a value from the group to an arithmetic logic unit;

providing a predetermined value to the arithmetic logic unit;

comparing the value from the group and the predetermined value in the arithmetic logic unit;

setting a selector to one of a first and second state, the first state to select a minimum and the second state to select a maximum;

selecting one of the value and the predetermined value as an extremum based on a flag set by the comparison in the arithmetic logic unit and the selector;

bit-shifting the count register count to produce a shifted count register count;

replacing the predetermined value with the extremum and storing the shifted count register count when the selector is set to the second state and the value is greater than the predetermined value; and packing at least one traceback bit with the shifted count register count.

11. A method as recited in claim 10, wherein the method is conducted in a pipeline environment.

12. A method as recited in claim 10, further comprising the steps of:

changing the count register count; and providing another value from the group for comparison to the predetermined value.

13. A method of identifying an extremum value and an index in a group of values, each value having an associated index, comprising the steps of:

initializing a count register to count;

providing a value from the group to an arithmetic logic unit;

providing a predetermined value to the arithmetic logic unit;

comparing the value from the group and the predetermined value in the arithmetic logic unit;

setting a selector to one of a first and second state, the first state to select a minimum and the second state to select a maximum;

selecting one of the value and the predetermined value as an extremum based on a flag set by the comparison in the arithmetic logic unit and the selector;

replacing the predetermined value with the extremum and storing the shifted count register count when the selector is set to the second state and the value is greater than the predetermined value; and packing the counter register count and a traceback bit that indentifies a branch origin at a previous symbol instant into a single register.

14. A method of identifying an extremum value and an index in a group of values, each value having an associated index, comprising the steps of:

initializing a count register to count;

providing a value from the group to an arithmetic logic unit;

providing a predetermined value to the arithmetic logic unit;

comparing the value from the group and the predetermined value in the arithmetic logic unit;

setting a selector to one of a first and second state, the first state to select a minimum and the second state to select a maximum;

selecting one of the value and the predetermined value as an extremum based on a flag set by the comparison in the arithmetic logic unit and the selector;

replacing the predetermined value with the extremum and storing the shifted count register count when the selector is set to the second state and the value is greater than the predetermined value; and shifting the count register count by a predetermined number of bit positions; and inserting a predetermined number of traceback bits, corresponding to the predetermined number of bit positions, into the bit positions made available due to shifting the counter register count.

15. A method as recited in claim 14, wherein the shift is a left shift.

16. A method as recited in claim 14, wherein the shift is a right shift.

17. A method as recited in claim 14, wherein the predetermined number of bit positions is one.

18. A method as recited in claim 14, wherein the predetermined number of bit positions is two.

19. A method as recited in claim 4, further comprising the steps of:

changing the count register count; and providing another value from the group for comparison to the predetermined value.

20. A method as recited in claim 4, wherein the method is conducted in a pipeline environment.

21. A method as recited in claim 13, further comprising the steps of:

changing the count register count; and providing another value from the group for comparison to the predetermined value.

22. A method as recited in claim 13, wherein the method is conducted in a pipelined environment.

23. A method as recited in claim 14, further comprising steps of:

changing the count register count; and providing another value from the group for comparison to the predetermined value.

24. A method as recited in claim 14, wherein the method is conducted in a pipeline environment.

* * * * *